(12) United States Patent
Schuster

(10) Patent No.: US 6,522,484 B1
(45) Date of Patent: Feb. 18, 2003

(54) PROJECTION OBJECTIVE

(75) Inventor: Karl-Heinz Schuster, Königsbronn (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/444,063

(22) Filed: Nov. 19, 1999

(30) Foreign Application Priority Data

Nov. 30, 1998 (DE) .......................................... 198 55 157

(51) Int. Cl.[7] .......................... G02B 17/00; G02B 9/00; G02B 13/04
(52) U.S. Cl. .................. 359/733; 359/754; 359/649; 359/756
(58) Field of Search ................. 359/754, 649, 359/755, 733, 756

(56) References Cited

U.S. PATENT DOCUMENTS

| | | | |
|---|---|---|---|
| 5,448,408 A | 9/1995 | Togino et al. ............... | 359/651 |
| 5,469,299 A | 11/1995 | Nagano ....................... | 359/661 |
| 5,805,344 A | 9/1998 | Sasaya et al. ............... | 359/649 |
| 5,835,285 A * | 11/1998 | Matsuzawa et al. ........ | 359/754 |
| 5,930,049 A * | 7/1999 | Suenaga et al. ............ | 359/650 |
| 5,982,558 A * | 11/1999 | Furter et al. ............... | 359/649 |
| 6,198,576 B1 * | 3/2001 | Matsuyama .................. | 359/649 |

FOREIGN PATENT DOCUMENTS

| | | | | |
|---|---|---|---|---|
| DE | 196 53 983 A1 | 12/1996 | ........... | G02B/13/24 |
| DE | 197 43 236 A1 | 9/1997 | ............. | G03F/7/20 |
| DE | 198 18 444 A1 | 4/1998 | ........... | G02B/13/18 |
| EP | 0 770 895 A2 | 11/1995 | ........... | G02B/13/14 |
| EP | 0 803 755 A2 | 5/1996 | ............ | G02B/9/62 |
| EP | 0 783 137 A2 | 9/1996 | ............. | G03F/7/20 |
| EP | 0 828 171 A2 | 8/1997 | ........... | G02B/13/22 |
| EP | 0 828 171 A3 | 8/1998 | ........... | G02B/13/22 |
| JP | 410260349 | * 3/1997 | | |
| JP | 410260349 A | * 3/1997 | | |

OTHER PUBLICATIONS

Document No. XP–000882444 titled Optical Lithography Thirty years and three orders fo magnitude by John H. Bruning, pp. 14–27.

European Search Report for corresponding European Patent Application dated Jan. 24, 2002.

* cited by examiner

Primary Examiner—Evelyn A. Lester
Assistant Examiner—Tim Thompson

(57) ABSTRACT

A projection objective, particularly for microlithography at 248 nm or 193 nm has, after two bulges and two waists, a pronounced lens arrangement that preferably contains a further waist and the system diaphragm (AS). This is markedly set back from the negative lens group containing the second waist, and is surrounded by important correction devices. The highest numerical aperture (0.65–0.80) is attained with the smallest lens diameters and by paying heed to the further qualities required for such a microlithography projection objective.

50 Claims, 8 Drawing Sheets

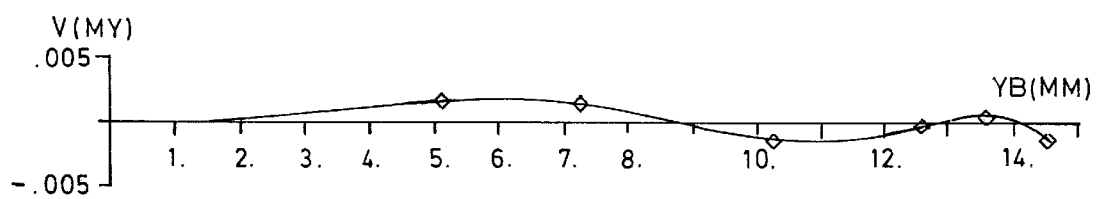
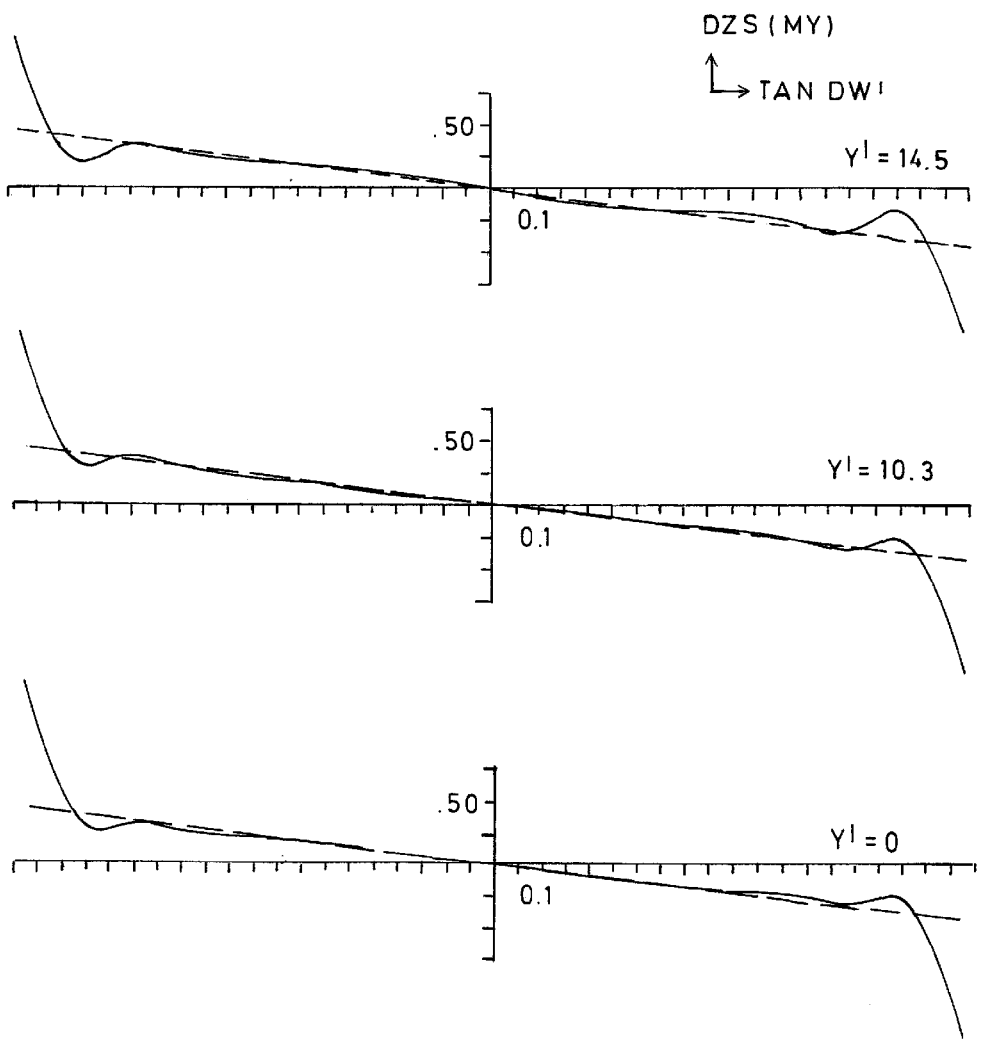

PROJECTION OBJECTIVE

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

Field of the Invention

The invention relates to a projection objective with at least two waists and three bulges, as was developed for microlithography and for example is known from the patent application (not prior published) "Mikrolithographisches Reduktionsobjectiv, Projektions-belichtungs-Anlage und-Verfahren" ("Microlithograpbic Reduction Objective, Projection Exposure Equipment and Process") of the invention priority of the same priority date, and the documents cited therein. An example therefrom is, e.g., U.S. patent application Ser. No. 09/416,105. This application and the documents cited therein are incorporated herein by reference.

The required reduction in size of the projected structures leads to working with progressively lower wavelengths of the light used. Of importance here are the excimer laser sources at 248 nm, 193 nm and 157 nm.

While purely quartz glass objectives are usable at 248 nm, a partial achromatization is required at 193 nm because of the increasing dispersion of quartz glass, and calcium fluoride is available as a second material for combination with quartz glass for this purpose.

However, calcium fluoride lenses have to be used as sparingly as possible for various reasons, from the availability of large, homogeneous crystals to the feasibility of optical processing.

It makes little sense to reduce the wavelengths and introduce completely new system technologies if the numerical aperture is not kept up to the high level attained (above 0.6, preferably 0.65 and more), since the resolution is in fact determined by the quotient lambda/NA.

For other wavelengths also, particularly for purely quartz glass DUV systems, an increase of the numerical aperture is sought, without a further increase of the lens diameter, since the limits of production feasibility are then also reached.

SUMMARY OF THE INVENTION

The invention therefore has as its object to provide a projection objective that makes possible the highest numerical aperture with the smallest lens diameter, taking note of the additional properties required in a microlithographic projection objective.

This object is successfully attained by the following measures that relate to the lens groups situated after the second waist and in front of the image, to the position of the system diaphragm, and to the constitution of the diaphragm space, and provide for a novel constriction (beam waist, reduction of beam diameter) there.

The projection objective has a lens arrangement with a first positive lens groups (LG1), a first negative lens group (LG2), a second positive lens group (LG3), a second negative lens group (LG4), and a further lens arrangement (LG5–LG7) containing a system diaphragm (AS), wherein at least one of the two next lenses before or after said system diaphragm AS has negative refractive power.

The projection objective includes a lens arrangement with: a first positive lens group (LG1), a first negative lens group (LG2), a second positive lens group (LG3), a second negative lens group (LG4), a further lens arrangement (LG5–LG7) containing a system diaphragm (AS), and at least three lenses before said system diaphragm (AS).

The projection objective with a lens arrangement has a first positive lens group (LG1), a first negative lens group (LG2), a second positive lens group (LG3), a second negative lens group (LG4), a further lens arrangement (LG5–LG7) containing an system diaphragm (AS), and at least one spherically over-correcting air space between adjacent lenses in front of said system diaphragm (AS).

The projection objective with at least two waists and three bulges, has a system diaphragm (AS) arranged in a region of a last bulge on an image side of said projection objective, and a pair of lenses before or after said system diaphragm (AS), wherein at least one lens of said pair of lenses is negative.

Advantageous possible combinations of the above measures according to the invention are shown in the preferred embodiments.

A particularly advantageous embodiment of the invention has a high numerical aperture of above 0.65 or 0.70. This can indeed count as an object that is always set per se; however, it is an outstanding feature of the invention that these values are reliably attained, and indeed under otherwise usable conditions such as image field and the like.

An advantageous construction according to the invention is an objective of a single material, in particular a quartz glass objective such as is provided for DUV at 248 nm. An advantageous embodiment has two different lens materials. A partially achromatized objective (e.g., for 193 nm) with quartz glass and calcium fluoride is an advantageous embodiment. The wide applicability of the objective design is apparent from this, and it can also be applied to other wavelengths, such as 365 nm or 157 nm, eventually using other lens materials.

In an advantageous embodiment of the correction means of the negative lens in the diaphragm space, the negative lenses are provided on both sides of the aperture diaphragm.

Advantageously, there are likewise provided in this region two spherically over-correcting air spaces, the middle thickness of which is thus greater than the thickness at the edge.

An advantageous constructional feature for the region of the first positive lens group includes two negative lenses provided among the first three lenses on the object side, preferably the first lens being negative. This helps to reach high apertures with good Petzval correction.

Advantageously, the projection objective according to the invention is incorporated in a projection exposure equipment for microlithography, with which an increased imaging performance can be effected, for example, with laser light at 248 nm or 193 nm, within the scope of conventional constructions.

An advantageous process for the production of microstructured components, with such a projection exposure equipment and a projection objective is as follows: exposing a substrate provided with a photosensitive layer by a mask and a projection objective and structuring the photosensitive layer corresponding to a pattern contained on said mask.

BRIEF DESCRIPTION OF THE DRAWINGS

The invention is described in more detail with reference to the accompanying drawings, in which.

DETAILED DESCRIPTION OF PREFERRED EMBODIMENTS

A partially achromatized refractive 193 nm lithographic objective requires at least two optical materials. Quartz glass and calcium fluoride ($CaF_2$) are the most suitable for this. In the case of $CaF_2$, there are deficiencies in homogeneity and in double refraction (besides other crystal defects and inclusions). In order to keep the effect of double refraction small, the optical path length in the crystal must be as small as possible, i.e., as little as possible of the quantity of the crystal must be used in the objective. This similarly applies as regards the detrimental effects of inhomogeneity, and in addition the crystal must be located as near as possible to the pupil, so that the effects of inhomogeneity do not vary over the image height. This is more successfully achieved, the closer the crystal is to the system diaphragm. The reduction of the crystal volume is also a necessity as regards the restricted quantity available and, not least, a quite considerable question of cost.

A particular problem regularly arises in the achromatization of a lithographic objective with $CaF_2$ in the positive lenses in the diaphragm region, all the other lenses being quartz glass: there is only a small action on longitudinal color errors when $CaF_2$ is substituted for quartz glass in the positive lens, even if the most effective possibilities of use according to the invention are applied. This is a consequence of the small difference of the dispersion of quartz glass and $CaF_2$. An unfavorable transverse color error occurs at the same time. There are often more lenses which can be substituted behind the diaphragm than in front of the diaphragm. If a diameter is required for the $CaF_2$ lenses which is smaller than that which would be acceptable for a purely quartz glass objective with good transverse color error correction, an unfavorable transverse color error arises. In order to maintain the Petzval correction of the objective, the second bulge in a typical three-bulge construction becomes larger when the third bulge has to be smaller.

If it is desired to construct a high aperture lithographic objective with, e.g., an NA on the object side greater than or equal to 0.65 and at the same time small $CaF_2$ lens diameters, the situation becomes dramatically more critical.

In order to reduce the transverse color errors again, positive $CaF_2$ lenses have to be introduced in the second bulge. This however violates the requirement for positioning near the diaphragm, and in addition it is the second bulge which is now large in diameter.

Figure 1:
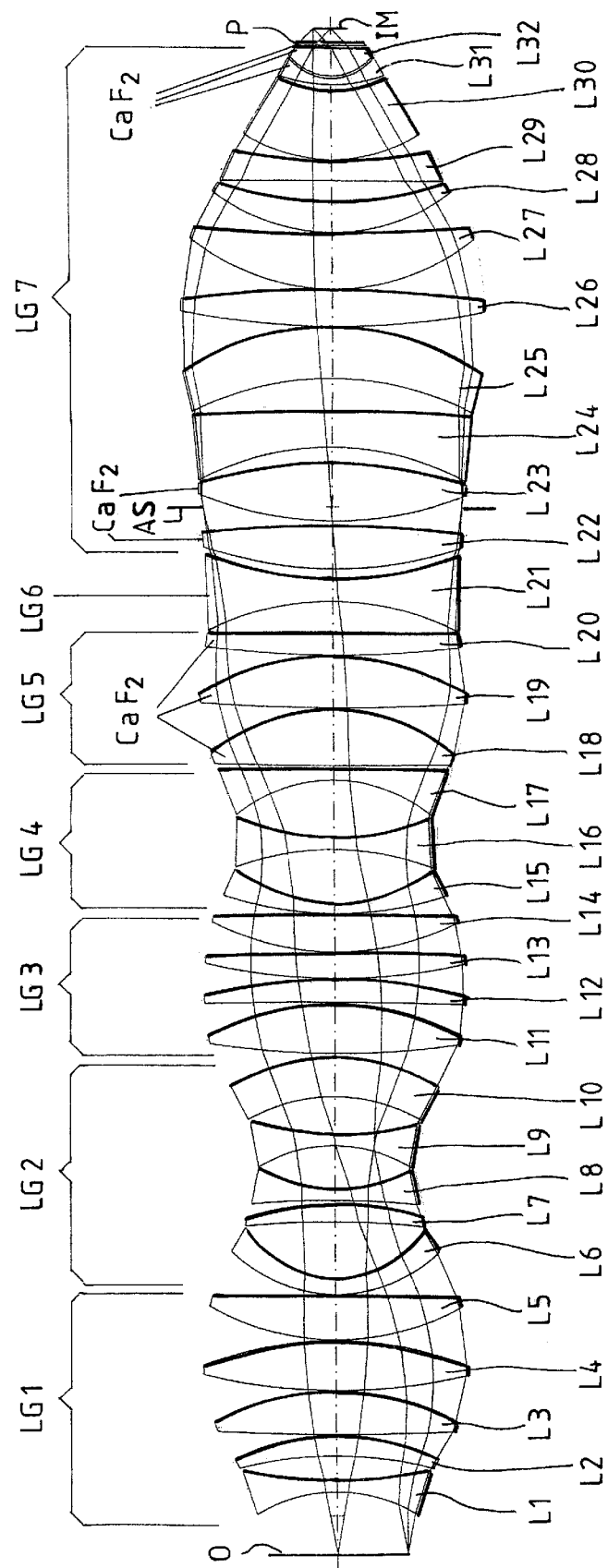
FIG. 1 shows the lens section of a first embodiment with NA=0.7.

The solution of the problem according to the invention consists of a construction which is next explained with reference to the example of FIG. 1 and Table 1: the $CaF_2$ lenses L18–L20, L22, L23 are made smaller in diameter, and the second bulge LG3 is likewise made small. The transverse color errors thus remain small, but not yet small enough: with this alone, the Petzval correction would now be considerably violated, and a strongly curved, unusable image field would result. In order to restore the Petzval correction, substantially without detriment to the transverse color errors, the first bulge LG1, as can be seen in the example of FIG. 1, is considerably enlarged in diameter. This is obtained by the lens sequence (L1–L8 of the LG1 and LG2)–++++–+–. Other sequences, for example +–+++–+, are likewise possible, but not quite so effective. Other sequences, such as e.g. –+++–+, are feasible with aspherization.

However, these measures are not sufficient to effect the Petzval correction. The "third bulge" would also have to be larger. This is however not acceptable, since the $CaF_2$ lenses L18–L20, L22, L23 are situated here. The solution of the problem consists of the conversion of the third bulge into a double bulge LG5–LG7. The first portion LG5 of the double bulge is small in diameter and is fully mounted with $CaF_2$ lenses L18–L20. A lens L21 with strong negative refractive power is seated in the narrowing (waist) LG6. The second partial bulge LG7 likewise starts with $CaF_2$ lenses L23, L24, which are still small in diameter. The diameter then strongly increases. This is possible due to the strongly negative refractive power of the lens L24 which is adjacent to the $CaF_2$ lenses L22, L23. A markedly curved converging meniscus L25, which is concave on the object side, increases the widening of diameter (it reduces the transverse color errors and assists in obtaining small diameters in the diaphragm region). A strongly positive group L26–L28 now converges from the large diameter toward the image IM. It is finally attained by means of this group with large diameter and strongly positive refractive power that the system can at the same time be outstandingly corrected with regard to Petzval curvature and to transverse color errors.

This arrangement reduces the longitudinal color errors. The large refractive power of the $CaF_2$ lenses L18–L20 in the first portion LG5 of the double bulge is likewise very helpful to the solution of the transverse color error problem.

The partial achromatization of a 193 nm lithographic objective is attained by the solution of the addressed problem. Five $CaF_2$ lenses L18–L20, L23, L24, all near the system diaphragm AS as shown in the example, are sufficient to attain an NA=0.7 and an image field of 29.1 mm with a bandwidth of 0.5 pm. The reduction factor amounts to 4.0. The objective is telecentric on the image side. All the $CaF_2$ lenses are smaller than 220 mm in (optically required) diameter, and in the example have a total thickness of less than 200 mm. Overall, there are 32 lenses in the objective.

The two lenses L31, L32 situated at the end on the image side, and the flat closure plate P (for protection of the objective) are likewise made of $CaF_2$. However, this has nothing to do with the achromatization: the light intensity here is the highest, and $CaF_2$ is more stable to radiation than is quartz glass, particularly as regards "compaction".

The beam heights $H_{max}$ given in Table 1 and well traced in FIG. 1 clearly show how a bulge is formed at the lens L4 in the first lens group LG1, a waist is formed in the second (LG2) between lenses L8 and L9, a bulge in the third (LG3) at the lens L12, a waist in the fourth (LG4) to the lens L16.

Less strongly modulated than these, the further lens groups LG5–LG7 form a bulge at the lens L19, a third waist at the negative lens L21, which is first present in this invention, and a fourth bulge at the lens L26.

The system diaphragm AS is arranged between this new waist (L21) and the fourth bulge (L26). It is significant that the system diaphragm is surrounded by two negative lenses L21, L24, respectively only separated by one positive lens L22, L23 of CaF$_2$.

This grouping is characterizing according to the invention for the design approach found for correction of the objective; this is indeed lengthened, but the lens diameter is kept limited in that it is kept substantially stable over wide regions.

Also significant are the air spaces between the lenses L20/L21, L21/L22 and L23/L24 with greater middle thickness than edge thickness, thus acting with a spherically over-correcting effect. Such an air space, as finds embodiment according to the invention, is primarily important ahead of the aperture system AS. However, the pairing in the sense of the invention, by which the invention is further optimized, is also advantageous.

A special feature of the preferred embodiments according to the invention is that the aperture system AS is moved far away from the second negative lens group LG4. Five lenses, L18 through L22, are situated there between in the example of FIG. 1.

The correction of this embodiment example attains 23 m$\lambda$. Helium is provided as the gas filling.

Figure 2:
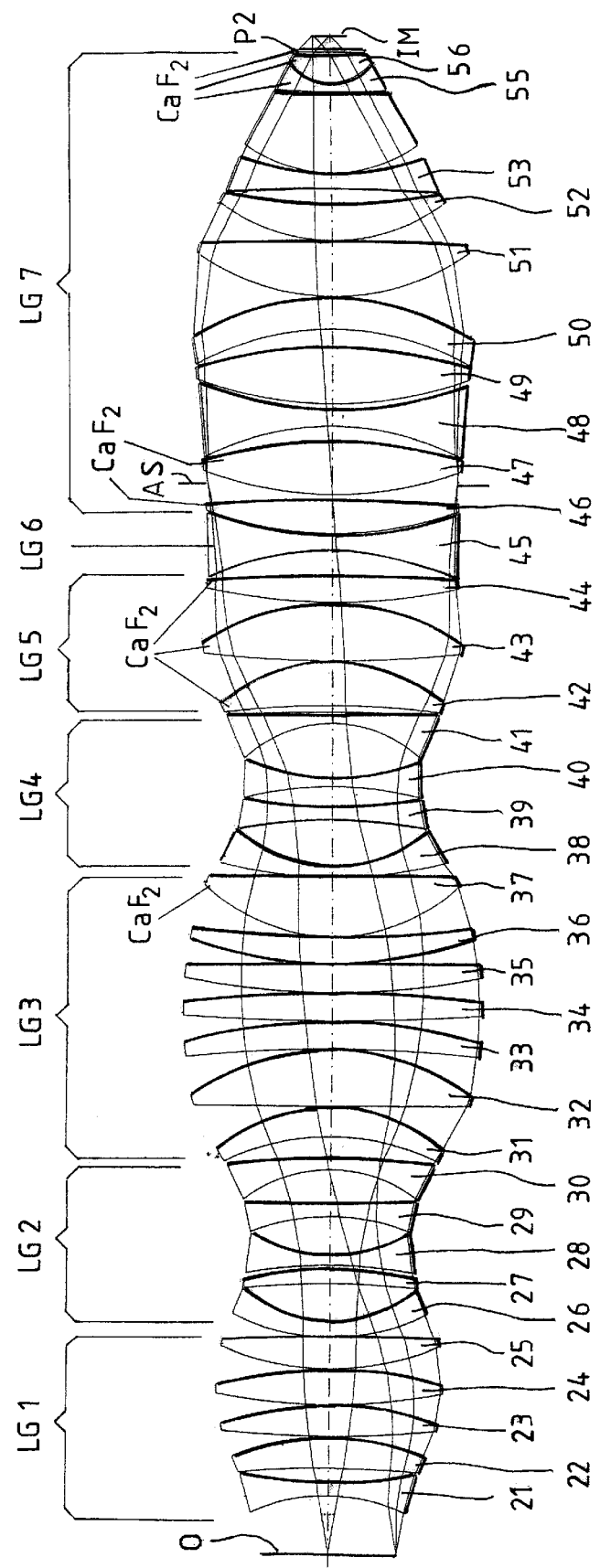
FIG. 2 shows the lens section of a second embodiment with NA=0.7.

The embodiment according to FIG. 2 and Table 2 differs from the embodiment of FIG. 1 substantially in that a CaF$_2$ lens L37 is also provided for color correction in the third lens group LG3, between the second bulge and the second waist. This also has a moderate diameter here, combined with a good effect. A positive lens 49 is arranged between the negative lens L48 which follows the system diaphragm AS and the concave meniscus 50 on the object side, and was withdrawn from the succeeding convergent group. With the same performance, the overall number of lenses is greater than in FIG. 1.

Figure 3:
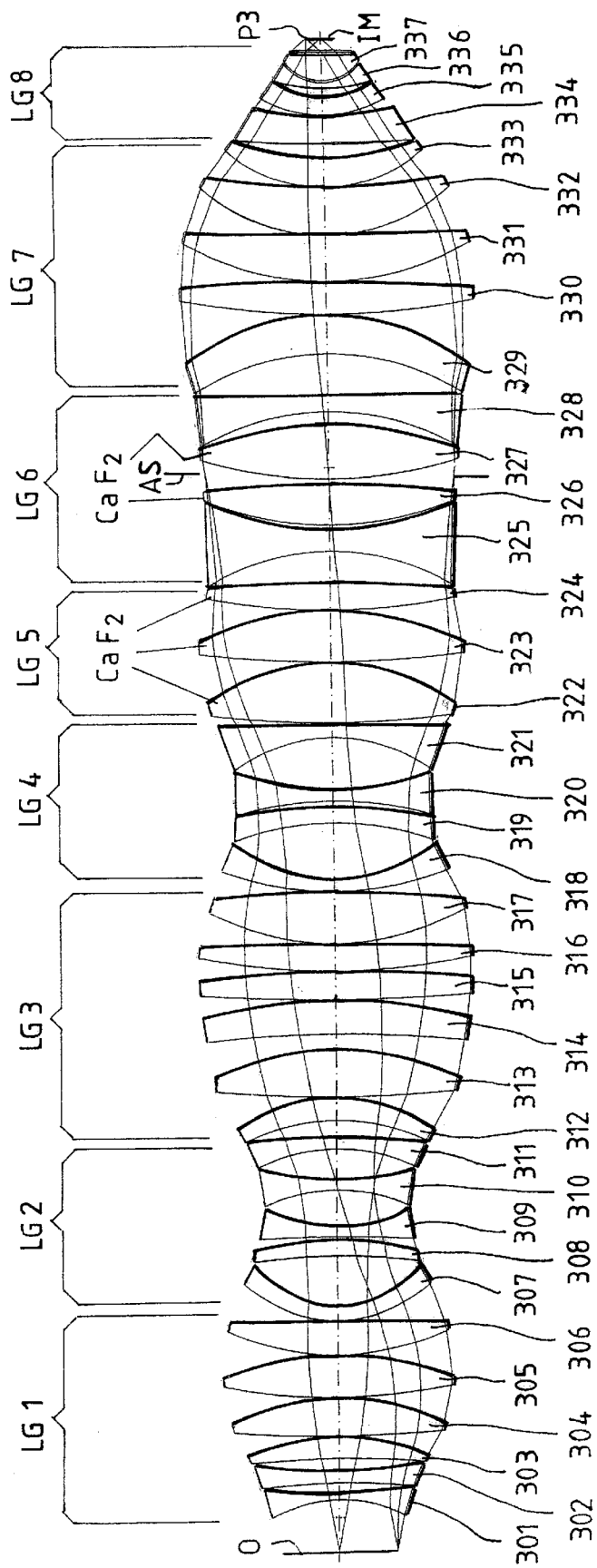
FIG. 3 shows the lens section of a third embodiment with NA=0.75.

The embodiment of FIG. 3 has the characterizing data of Table 3.

The total number of lenses has increased to 37. The first lens L1 is divided into the two negative lenses 301, 302. This facilitates the strong beam widening for the benefit of the Petzval correction while obtaining the other favorable aberration values. A further elaboration of the first lens to a further, independent lens group is possible. The meniscus L10 is divided into the lenses 311, 312. A convergent lens 317 has been introduced into the third lens group LG3 for this purpose. Also, the lens L16 in the waist LG4 has been divided into two lenses 319, 320. LG5 remains unchanged, and is now followed by 13 instead of 12 lenses. The degrees of freedom thus attained are useful in order to compensate the drastically increased error loading accompanying the increased aperture of NA=0.75.

The lenses following the fifth lens group with the third bulge are described for this embodiment in a deviating group division (without anything substantially thereby changing).

The group LG6 includes the fourth beam waist at the lens 325 and the system diaphragm AS, surrounded by two negative lenses 325, 328 with interposed positive CaF$_2$ lenses 326, 327. As in FIG. 1, this group is supported in its corrective action by biconvex air lenses before and after the two negative lenses 325, 328. The lens group LG7 includes the concave meniscus 329 on the object side and four convergent lenses 330–333. The fourth bulge is formed at lens 330. This region corresponds to the focusing group of FIG. 1.

The following lens group LG8, here indicated separately, has further negative refractive power. Its function is common to the objectives of the category concerned. It provides for the high beam angle corresponding to the numerical aperture to first appear in the last lenses before the image IM, and thus at the same quite importantly for the lens diameter to remain restricted. The thick meniscus L30 of FIG. 1 is divided here into two menisci 334, 335.

Figure 4:
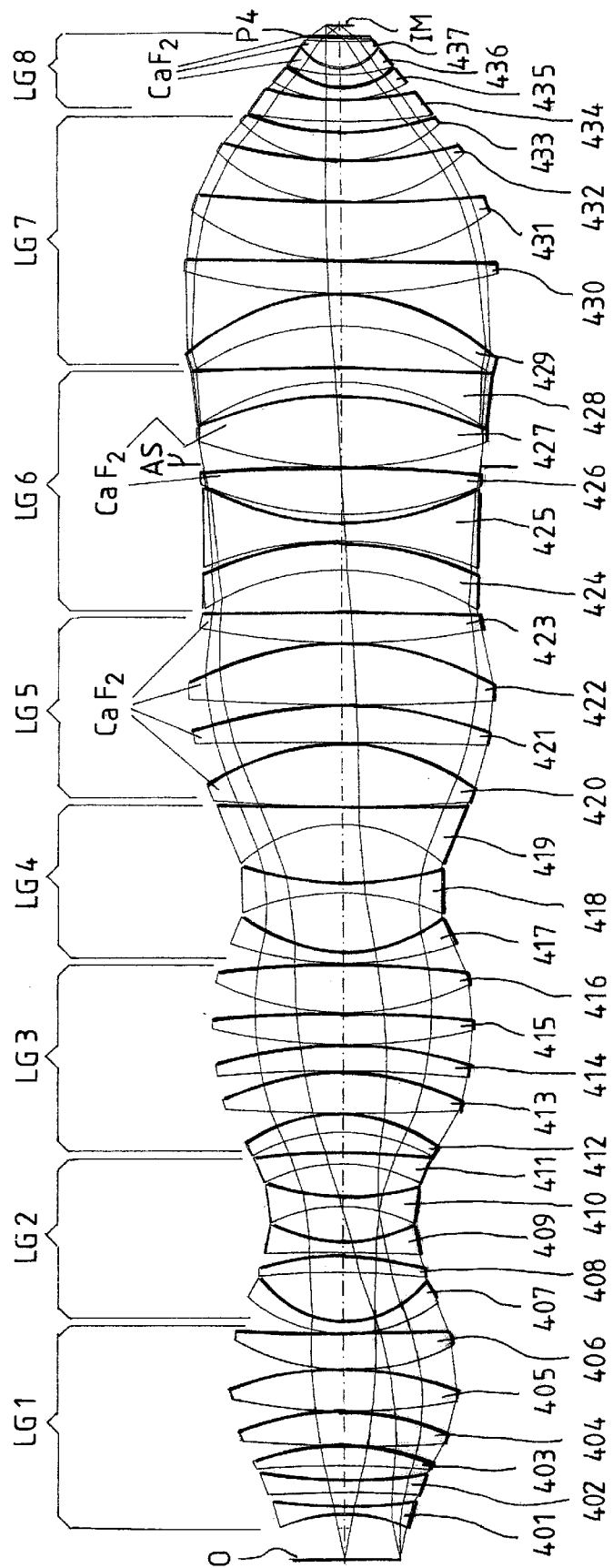
FIG. 4 shows the lens section of a fourth embodiment with NA=0.8.

The fourth embodiment according to FIG. 4 and Table 4 has a farther increase of numerical aperture to 0.8. The number of lenses is likewise 37 here. In contrast to FIG. 3, the lens groups LG3 and LG4 are simplified again. However, LG5 now has an additional positive lens 423. LG6 is also provided with additional correction function by dividing the negative lens 325 into a meniscus 424 and a negative lens 425, with a considerable increase of thickness. The meniscus 429 in the lens group LG7 has become thinner, to the benefit of the convergent lens 431.

As in the embodiments of FIG. 1 and FIG. 3, for achromatization, the positive lenses 420–423 of the lens groups LG5 and LG6 in the neighborhood of the diaphragm are made of CaF$_2$. The largest diameter of a CaF$_2$ lens is attained at lens 22 with a diameter of 315 mm. The largest lens overall is lens 430 with a diameter of 325 mm. These values are of course demanding as regards production technology, but are not too high in view of the performance of the objective. The lenses 436 and 437, as well as the closure plate P4, are also made of CaF$_2$ for reasons of compaction, as explained in regard to FIG. 1.

Figure 5:
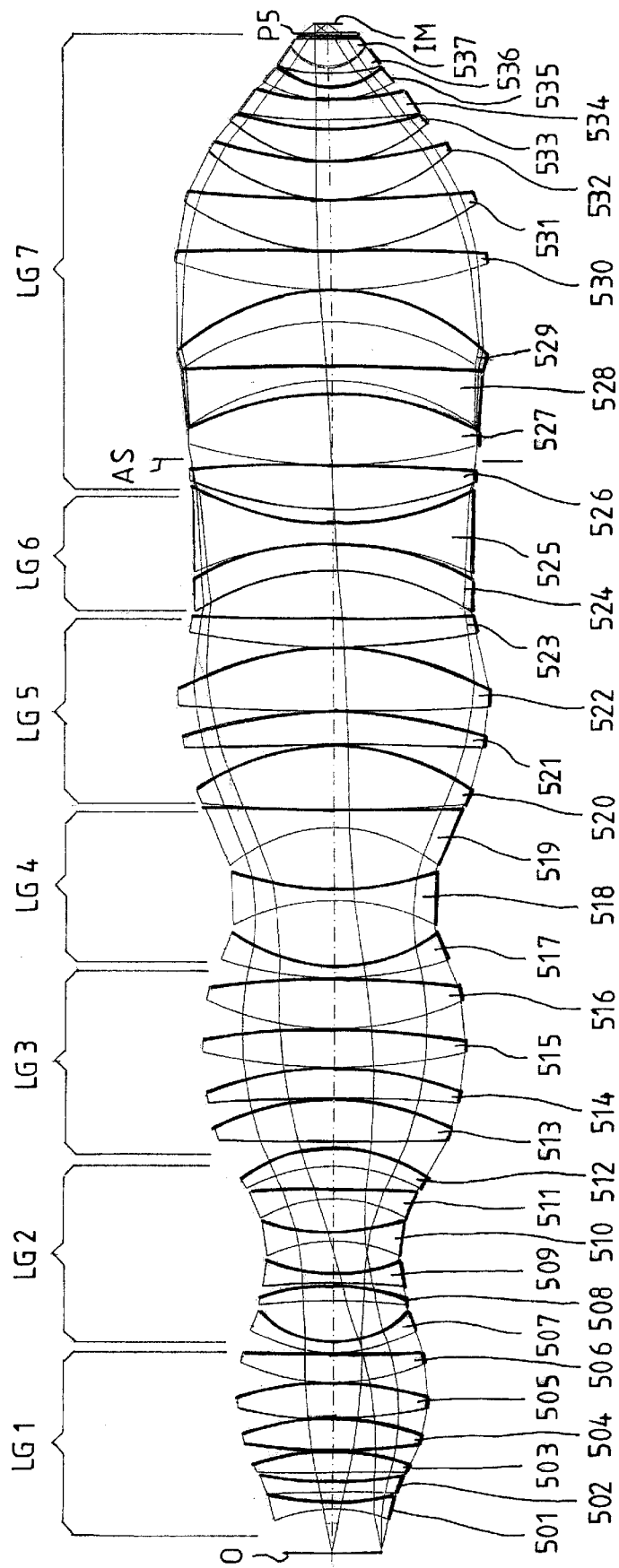
FIG. 5 shows the lens section of a fifth embodiment with NA=0.8, as a purely quartz lens objective for 248 nm.

A fifth embodiment is presented in FIG. 5 and Table 5, likewise with the extreme numerical aperture of 0.8. This is a DUV objective for 248 nm, which is embodied as a purely quartz objective.

In comparison with other types of objectives, the overall length is indeed large, with Ob-IM=1695 mm; however, it succeeds in embodying the large NA=0.8 with an image field diameter of 27.2 mm and a greatest lens diameter of 341 mm (lens 529).

The longitudinal color error CHV (500 pm)=0.11 mm is further improved, with good transverse color error CHV (500 pm)=−0.41 mm, and a greatest RMS error=18.7 m$\lambda$ over the whole image field.

As in the embodiment of FIG. 4, 37 lenses are arranged here, in substantially the same construction. The concept according to the invention also proves effective here: starting from the construction with two waists (LG2, LG4) and the two first bulges (LG1, LG3) of the beam of light, there are provided, not a simple third bulge, but a double bulge LG5, LG7 divided by a third waist LG6, even if this is not strongly pronounced. The system diaphragm AS is then arranged in this near the waist LG6, between negative lenses 525, 528.

Figure 6:
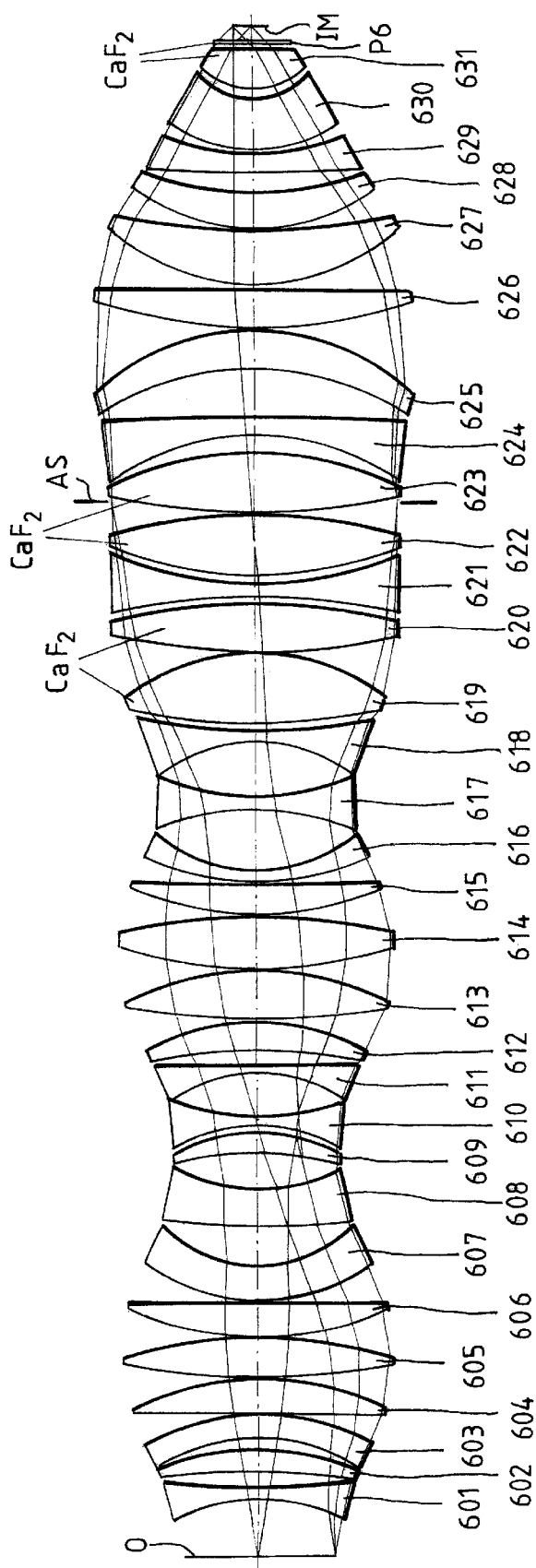
FIG. 6 shows the lens section of a sixth embodiment.

The embodiment according to FIG. 6 and Table 6 is again designed for a 193 nm excimer laser, and has a numerical aperture of NA=0.7 on the image side. However, the number of lenses, 31, is markedly reduced in contrast to the preceding examples. Also, with four achromatizing CaF$_2$ lenses and a compaction-preventing CaF$_2$ lens plus CaF$_2$ flat plate P6, fewer CaF$_2$ elements are used. Overall, this gives considerable savings in production costs.

The essential special feature is that the first three lenses 601, 602, 603 after the object plane 0 have negative, positive and negative (−+−) refractive power, the third lens being a meniscus, concave on the object side. In comparison, in the examples according to FIGS. 1 and 2, −++ arrangements, and according to FIGS. 3–5, −−+ arrangements, are provided, the second + lens being biconvex in FIGS. 1 and 2.

This measure succeeds in bringing the diameter of the first lens group (at the lens 605) up to the level of the second lens group (at lens 614), and thus already giving a favorable effect on the Petzval sun in the first lens group. At the same time, telecentricity, distortion and further imaging errors can be optimized.

A further development of the first lenses into an independent lens group is likewise possible here.

Two biconvex positive $CaF_2$ lenses 622, 623 are arranged on either side of the system diaphragm AS, framed by two negative quartz glass lenses, lenses 621, 624. Respective positive air lenses are provided therebetween, as are also provided in the preceding examples, as typical correction means.

Only two positive $CaF_2$ lenses are used upstream of this, and hence only four $CaF_2$ lenses in all are used for achromatization.

Thereafter, the lens 624 is constituted as a positive meniscus, concave on the object side, as is likewise typical for the kind of objective represented.

A third waist is here present only faintly at the surface on the object side of the lens 624. However, the typical long region of stable lens diameter is constituted around the system diaphragm AS.

At the end on the image side, the lens pair with a strongly curved, thin air gap, present in the preceding examples, has been successfully united into a thick lens 631. This, together with the preceding lens 630 and the flat closure plate P6, is made of $CaF_2$, for protection from disturbing compaction effects as in the preceding examples.

The good correction attained in this example is shown by the aberration curves of FIG. 7. FIG. 7a gives the distortion (in $\mu$m) as a function of the image height YB (in mm). Its greatest contributions amount to 2 nm.

FIG. 7b gives the sagittal transverse aberration DZS as a function of the half aperture angle DW', for image heights Y'=14.5 mm, 10.3 and 0.

Figure 7C:
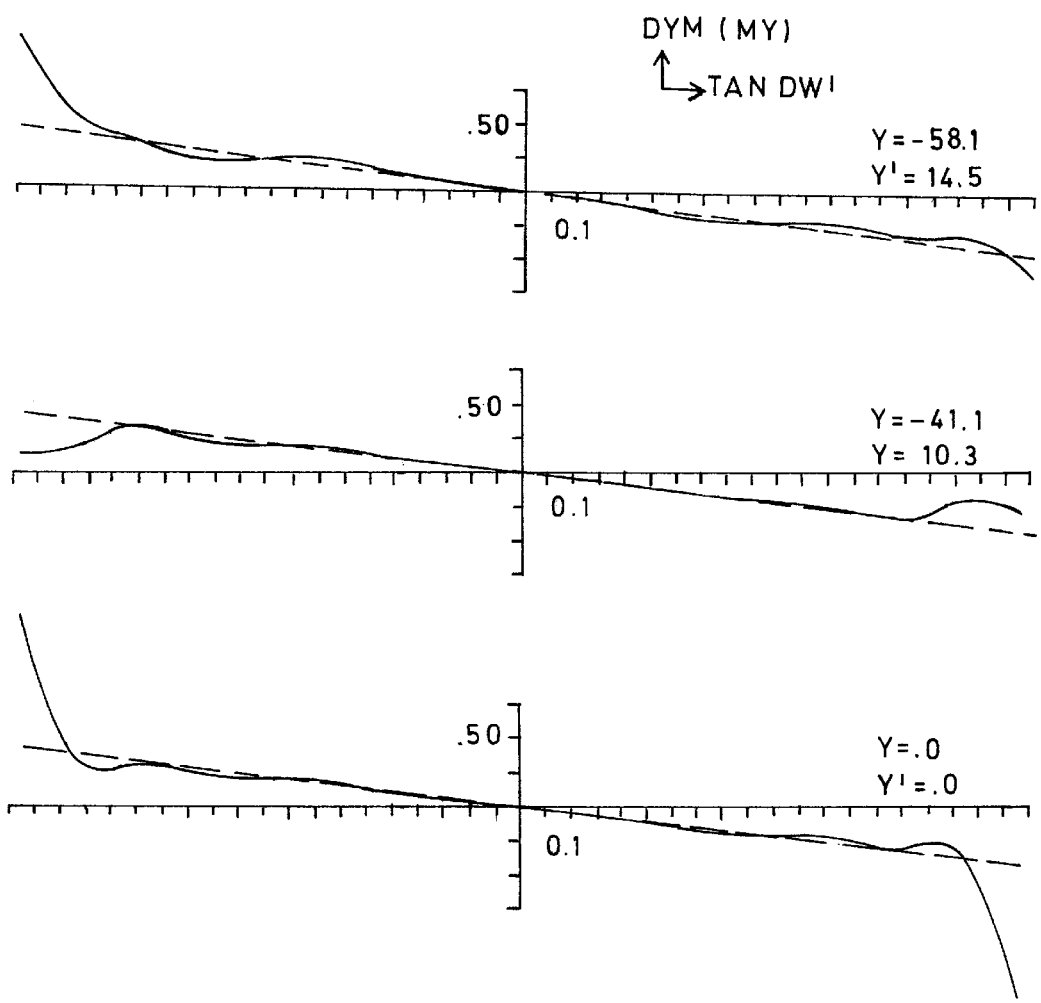
FIGS. 7(a–c) shows typical aberrations in the case of the sixth embodiment.

FIG. 7c gives the meridional transverse aberration DYM, for the same image heights. Both show an outstanding course up to the highest DW'.

The various examples show the great applicability of this concept for different embodiments at very high apertures.

Overall, the arrangement according to the invention succeeds in providing classical, axially symmetrical, purely refractive objectives with high numerical aperture, for microlithography with structure widths below 0.2 $\mu$m, and whose qualities recently only were expected from catadioptric or catoptric systems.

TABLE 1

| | λ (193 nm) | | | |
|---|---|---|---|---|
| No. | r (mm) | d (mm) | Glass | $H_{max}$ (mm) |
| Ob | ∞ | 20.139 | | |
| L1 | −123.979 | 10.278 | $SiO_2$ | 64 |
| | 403.784 | 19.789 | | |
| L2 | −317.124 | 17.341 | $SiO_2$ | 78 |
| | −189.047 | .750 | | |
| L3 | 1942.788 | 36.025 | $SiO_2$ | 96 |
| | −210.589 | .750 | | |
| L4 | 493.421 | 41.364 | $SiO_2$ | 107 |
| | −314.691 | .750 | | |
| L5 | 211.644 | 36.468 | $SiO_2$ | 102 |
| | 36053.922 | .756 | | |
| L6 | 122.962 | 13.151 | $SiO_2$ | 84 |

TABLE 1-continued

| | λ (193 nm) | | | |
|---|---|---|---|---|
| No. | r (mm) | d (mm) | Glass | $H_{max}$ (mm) |
| | 87.450 | 46.263 | | |
| L7 | −741.457 | 14.677 | $SiO_2$ | 72 |
| | −245.743 | 3.094 | | |
| L8 | −708.992 | 9.066 | $SiO_2$ | 67 |
| | 132.207 | 35.782 | | |
| L9 | −119.439 | 9.425 | $SiO_2$ | 61 |
| | 254.501 | 31.157 | | |
| L10 | −143.292 | 32.973 | $SiO_2$ | 69 |
| | −162.944 | 2.513 | | |
| L11 | 673.137 | 41.208 | $SiO_2$ | 101 |
| | −230.715 | 1.371 | | |
| L12 | −3742.535 | 19.854 | $SiO_2$ | 105 |
| | −444.648 | .750 | | |
| L13 | 482.433 | 20.155 | $SiO_2$ | 105 |
| | −3294.813 | .750 | | |
| L14 | 221.831 | 31.717 | $SiO_2$ | 99 |
| | −3330.760 | .151 | | |
| L15 | 301.827 | 8.035 | $SiO_2$ | 90 |
| | 133.707 | 44.742 | | |
| L16 | −235.659 | 9.864 | $SiO_2$ | 79 |
| | 200.421 | 47.451 | | |
| L17 | −126.570 | 9.713 | $SiO_2$ | 79 |
| | −8830.267 | 2.058 | | |
| L18 | 3591.477 | 47.215 | $CaF_2$ | 96 |
| | −155.694 | .761 | | |
| L19 | 1671.774 | 42.497 | $CaF_2$ | 108 |
| | −212.059 | .754 | | |
| L20 | 767.377 | 20.436 | $CaF_2$ | 103 |
| | −2961.864 | 24.166 | | |
| L21 | −236.317 | 20.505 | $SiO_2$ | 101 |
| | 313.867 | 7.393 | | |
| L22 | 365.958 | 35.000 | $CaF_2$ | 105 |
| | −1015.913 | 15.000 | | |
| AS | ∞ | 4.055 | | 107 |
| L23 | 304.439 | 47.448 | $CaF_2$ | 109 |
| | −354.885 | 12.212 | | |
| L24 | −237.609 | 30.672 | $SiO_2$ | 108 |
| | −1864.732 | 26.398 | | |
| L25 | −255.995 | 43.703 | $SiO_2$ | 114 |
| | −220.445 | .050 | | |
| L26 | 661.898 | 30.058 | $SiO_2$ | 124 |
| | −944.348 | .052 | | |
| L27 | 186.291 | 45.831 | $SiO_2$ | 116 |
| | 1112.534 | .759 | | |
| L28 | 162.645 | 26.119 | $SiO_2$ | 97 |
| | 311.699 | 16.235 | | |
| L29 | 67979.776 | 16.754 | $SiO_2$ | 90 |
| | 371.623 | .784 | | |
| L30 | 131.714 | 57.413 | $SiO_2$ | 71 |
| | 98.261 | 4.425 | | |
| L31 | 134.217 | 4.625 | $CaF_2$ | 41 |
| | 44.911 | 2.076 | | |
| L32 | 43.874 | 22.782 | $CaF_2$ | 33 |
| | 678.386 | 2.262 | | |
| P | ∞ | 2.000 | $CaF_2$ | 27 |
| | ∞ | 12.000 | | |
| IM | | | | |

TABLE 2

| | λ (193 nm) | | | |
|---|---|---|---|---|
| No. | r (mm) | d (mm) | Glass | $H_{max}$ (mm) |
| 0 | ∞ | 15.691 | | 64 |
| 21 | −154.467 | 11.998 | $SiO_2$ | 64 |
| | 446.437 | 12.272 | | 73 |
| 22 | −723.377 | 25.9894 | $SiO_2$ | 74 |
| | −222.214 | .824 | | 80 |
| 23 | 920.409 | 26.326 | $SiO_2$ | 89 |
| | −287.371 | .750 | | 90 |
| 24 | 499.378 | 30.073 | $SiO_2$ | 94 |

TABLE 2-continued

λ (193 nm)

| No. | r (mm) | d (mm) | Glass | $H_{max}$ (mm) |
|---|---|---|---|---|
|  | −358.998 | .751 |  | 94 |
| 25 | 238.455 | 27.454 | $SiO_2$ | 90 |
|  | −3670.974 | .750 |  | 89 |
| 26 | 182.368 | 13.402 | $SiO_2$ | 81 |
|  | 115.264 | 31.874 |  | 72 |
| 27 | −710.373 | 13.095 | $SiO_2$ | 72 |
|  | −317.933 | 2.550 |  | 71 |
| 28 | 412.488 | 8.415 | $SiO_2$ | 69 |
|  | 132.829 | 32.913 |  | 65 |
| 29 | −184.651 | 11.023 | $SiO_2$ | 66 |
|  | 2083.916 | 28.650 |  | 71 |
| 30 | −120.436 | 10.736 | $SiO_2$ | 72 |
|  | −629.160 | 16.486 |  | 86 |
| 31 | −213.698 | 24.772 | $SiO_2$ | 89 |
|  | −151.953 | .769 |  | 95 |
| 32 | 11013.497 | 48.332 | $SiO_2$ | 115 |
|  | −202.880 | .750 |  | 118 |
| 33 | −1087.551 | 22.650 | $SiO_2$ | 122 |
|  | −483.179 | .750 |  | 124 |
| 34 | 1797.628 | 23.724 | $SiO_2$ | 125 |
|  | −1285.887 | .751 |  | 125 |
| 35 | 662.023 | 23.589 | $SiO_2$ | 124 |
|  | 45816.292 | .750 |  | 123 |
| 36 | 361.131 | 22.299 | $SiO_2$ | 119 |
|  | 953.989 | .750 |  | 117 |
| 37 | 156.499 | 49.720 | $CaF_2$ | 107 |
|  | 2938.462 | .154 |  | 103 |
| 38 | 377.619 | 8.428 | $SiO_2$ | 94 |
|  | 123.293 | 40.098 |  | 80 |
| 39 | −425.236 | 10.189 | $SiO_2$ | 78 |
|  | 413.304 | 18.201 |  | 74 |
| 40 | −302.456 | 6.943 | $SiO_2$ | 73 |
|  | 190.182 | 46.542 |  | 73 |
| 41 | −109.726 | 9.022 | $SiO_2$ | 73 |
|  | −1968.186 | 5.547 |  | 89 |
| 42 | −768.656 | 37.334 | $CaF_2$ | 90 |
|  | −145.709 | .753 |  | 94 |
| 43 | 925.552 | 49.401 | $CaF_2$ | 108 |
|  | −193.743 | .847 |  | 109 |
| 44 | 507.720 | 22.716 | $CaF_2$ | 105 |
|  | −1447.522 | 21.609 |  | 104 |
| 45 | −250.873 | 11.263 | $SiO_2$ | 104 |
|  | 314.449 | 2.194 |  | 105 |
| 46 | 316.810 | 28.459 | $CaF_2$ | 106 |
|  | −1630.246 | 4.050 |  | 106 |
| AS | Diagragm | 15.000 |  | 106 |
| 47 | 312.019 | 45.834 | $CaF_2$ | 108 |
|  | −355.881 | 11.447 |  | 108 |
| 48 | −242.068 | 14.119 | $SiO_2$ | 107 |
|  | 312.165 | 4.687 |  | 112 |
| 49 | 327.322 | 49.332 | $SiO_2$ | 114 |
|  | −372.447 | 14.727 |  | 115 |
| 50 | −234.201 | 26.250 | $SiO_2$ | 115 |
|  | −226.616 | .850 |  | 118 |
| 51 | 203.673 | 45.914 | $SiO_2$ | 113 |
|  | −3565.135 | .751 |  | 111 |
| 52 | 157.993 | 29.879 | $SiO_2$ | 94 |
|  | 431.905 | 14.136 |  | 90 |
| 53 | −1625.593 | 12.195 | $SiO_2$ | 83 |
|  | 230.390 | .780 |  | 76 |
| 54 | 124.286 | 66.404 | $SiO_2$ | 71 |
|  | 538.229 | 1.809 |  | 46 |
| 55 | 778.631 | 4.962 | $CaF_2$ | 45 |
|  | 43.846 | 2.050 |  | 34 |
| 56 | 43.315 | 23.688 | $CaF_2$ | 33 |
|  | 1056.655 | 2.047 |  | 29 |
| P2 | ∞ | 2.000 | $CaF_2$ | 27 |
|  | ∞ | 12.000 |  | 26 |
| IM | ∞ |  |  | 14 |

TABLE 3

| | |
|---|---|
| Image Side Numerical Aperture | 0.75 |
| Image Field Diameter | 29 mm |
| Number of Lenses | 37 |
| Therof $CaF_2$ | 5 |
| Chromatic Longitudinal Aberration | CHL (500 pm) = 0.15 mm |
| Chromatic Vertical Aberration | CHV (500)pm) = −0.55 mm |

TABLE 4

λ(193 nm)

| No. | r (mm) | d (mm) | Glass | $H_{max}$ (mm) |
|---|---|---|---|---|
| 401 | −162.231 | 7.821 | $SiO_2$ | 65 |
|  | 549.305 | 14.754 |  |  |
| 402 | −1637.355 | 13.618 | $SiO_2$ | 77 |
|  | 558.119 | 14.177 |  |  |
| 403 | −1250.520 | 21.761 | $SiO_2$ | 89 |
|  | −266.751 | .103 |  |  |
| 404 | 1413.418 | 35.164 | $SiO_2$ | 105 |
|  | −289.540 | .100 |  |  |
| 405 | 558.984 | 44.391 | $SiO_2$ | 117 |
|  | −330.447 | .052 |  |  |
| 406 | 236.035 | 37.754 | $SiO_2$ | 112 |
|  | 2512.736 | .100 |  |  |
| 407 | 149.568 | 12.990 | $SiO_2$ | 97 |
|  | 108.658 | 50.886 |  |  |
| 408 | −872.416 | 17.292 | $SiO_2$ | 85 |
|  | −295.279 | 3.065 |  |  |
| 409 | −2305.329 | 11.081 | $SiO_2$ | 80 |
|  | 175.377 | 36.326 |  |  |
| 410 | −170.438 | 10.667 | $SiO_2$ | 73 |
|  | 287.702 | 33.693 |  |  |
| 411 | −176.405 | 12.554 | $SiO_2$ | 80 |
|  | −646.797 | 20.615 |  |  |
| 412 | −185.487 | 19.173 | $SiO_2$ | 92 |
|  | −168.577 | .754 |  |  |
| 413 | 2643.150 | 43.274 | $SiO_2$ | 120 |
|  | −279.867 | .751 |  |  |
| 414 | −1446.340 | 26.732 | $SiO_2$ | 129 |
|  | −431.016 | .751 |  |  |
| 415 | 615.237 | 32.058 | $SiO_2$ | 134 |
|  | −1552.907 | .752 |  |  |
| 416 | 304.657 | 51.152 | $SiO_2$ | 131 |
|  | −1002.990 | .766 |  |  |
| 417 | 377.443 | 11.011 | $SiO_2$ | 115 |
|  | 174.347 | 61.706 |  |  |
| 418 | −265.771 | 10.574 | $SiO_2$ | 103 |
|  | 358.610 | 61.744 |  |  |
| 419 | −156.420 | 17.749 | $SiO_2$ | 104 |
|  | 4276.769 | .752 |  |  |
| 420 | 1792.611 | 65.815 | $CaF_2$ | 132 |
|  | −237.576 | .756 |  |  |
| 421 | −5418.034 | 38.924 | $CaF_2$ | 151 |
|  | −453.224 | .750 |  |  |
| 422 | 2719.661 | 63.360 | $CaF_2$ | 157 |
|  | −324.840 | .750 |  |  |
| 423 | 794.699 | 30.677 | $CaF_2$ | 146 |
|  | −7159.901 | 44.836 |  |  |
| 424 | −265.231 | 27.682 | $SiO_2$ | 141 |
|  | −340.529 | 2.566 |  |  |
| 425 | −377.893 | 19.008 | $SiO_2$ | 141 |
|  | 322.651 | 8.918 |  |  |
| 426 | 384.063 | 50.258 | $CaF_2$ | 144 |
|  | −1522.566 | .001 |  |  |
| AS | Diaphragm |  |  | 145 |
| 427 | 461.641 | 73.243 | $CaF_2$ | 149 |
|  | −346.299 | 14.306 |  |  |
| 428 | −265.687 | 14.512 | $SiO_2$ | 149 |
|  | −2243.987 | 44.637 |  |  |
| 429 | −273.302 | 32.232 | $SiO_2$ | 155 |
|  | −236.716 | .759 |  |  |
| 430 | 630.915 | 33.935 | $SiO_2$ | 162 |
|  | −33939.086 | .770 |  |  |
| 431 | 267.710 | 59.062 | $SiO_2$ | 154 |
|  | 1417.026 | 1.266 |  |  |

TABLE 4-continued

λ(193 nm)

| No. | r (mm) | d (mm) | Glass | $H_{max}$ (mm) |
|---|---|---|---|---|
| 432 | 186.762 | 42.895 | $SiO_2$ | 128 |
|  | 428.787 | .750 |  |  |
| 433 | 157.406 | 28.844 | $SiO_2$ | 103 |
|  | 286.130 | 12.072 |  |  |
| 434 | 642.977 | 21.646 | $SiO_2$ | 95 |
|  | 305.781 | .394 |  |  |
| 435 | 146.258 | 14.296 | $SiO_2$ | 69 |
|  | 95.566 | 11.824 |  |  |
| 436 | 177.258 | 5.877 | $CaF_2$ | 53 |
|  | 48.067 | 2.299 |  |  |
| 437 | 47.757 | 26.836 | $CaF_2$ | 39 |
|  | 545.368 | 3.220 |  |  |
| P4 | ∞ | 2.000 | $CaF_2$ | 32 |
|  | ∞ | 12.000 |  |  |
| IM | ∞ |  |  | 14 |

TABLE 5

λ (248 nm)

| No. | r (mm) | d (mm) | Glass | $H_{max}$ (mm) |
|---|---|---|---|---|
| 0 | ∞ | 14.767 |  |  |
| 501 | −168.448 | 7.819 | $SiO_2$ |  |
|  | 451.839 | 10.150 |  |  |
| 502 | −1469.667 | 12.827 | $SiO_2$ |  |
|  | 507.556 | 9.846 |  |  |
| 503 | 3953.186 | 24.517 | $SiO_2$ |  |
|  | −255.806 | .109 |  |  |
| 504 | 677.358 | 35.314 | $SiO_2$ |  |
|  | −291.838 | .717 |  |  |
| 505 | 514.352 | 37.652 | $SiO_2$ |  |
|  | −349.357 | 2.388 |  | 102 |
| 506 | 47.966 | 31.567 | $SiO_2$ |  |
|  | 4511.896 | .103 |  |  |
| 507 | 173.084 | 12.702 | $SiO_2$ |  |
|  | 114.678 | 44.986 |  |  |
| 508 | −699.118 | 16.715 | $SiO_2$ |  |
|  | −255.168 | 3.212 |  |  |
| 509 | −704.667 | 11.272 | $SiO_2$ |  |
|  | 204.972 | 33.860 |  |  |
| 510 | −169.644 | 12.141 | $SiO_2$ | 71 |
|  | 283.339 | 36.451 |  |  |
| 511 | −164.668 | 11.842 | $SiO_2$ |  |
|  | −1145.627 | 22.777 |  |  |
| 512 | −199.780 | 20.265 | $SiO_2$ |  |
|  | −176.684 | 7.310 |  |  |
| 513 | 8844.587 | 46.194 | $SiO_2$ |  |
|  | −273.661 | .761 |  |  |
| 514 | −1811.014 | 32.660 | $SiO_2$ |  |
|  | −386.108 | .755 |  |  |
| 515 | 626.689 | 42.026 | $SiO_2$ | 143 |
|  | −896.109 | .821 |  |  |
| 516 | 336.397 | 54.598 | $SiO_2$ |  |
|  | −1002.851 | .752 |  |  |
| 517 | 411.928 | 12.364 | $SiO_2$ |  |
|  | 183.595 | 73.688 |  |  |
| 518 | −237.160 | 12.074 | $SiO_2$ | 110 |
|  | 339.922 | 67.674 |  |  |
| 519 | −181.378 | 19.614 | $SiO_2$ |  |
|  | 3323.801 | .795 |  |  |
| 520 | 1648.704 | 72.249 | $SiO_2$ |  |
|  | −259.967 | .772 |  |  |
| 521 | −3288.150 | 36.331 | $SiO_2$ |  |
|  | −547.040 | .754 |  |  |
| 522 | 3160.321 | 71.293 | $SiO_2$ |  |
|  | −337.191 | .750 |  | 172 |
| 523 | 794.782 | 31.332 | $SiO_2$ |  |
|  | 3890.718 | 55.484 |  |  |
| 524 | −273.219 | 30.190 | $SiO_2$ | 152 |
|  | −316.643 | .894 |  |  |
| 525 | −358.789 | 20.418 | $SiO_2$ |  |

TABLE 5-continued

λ (248 nm)

| No. | r (mm) | d (mm) | Glass | $H_{max}$ (mm) |
|---|---|---|---|---|
|  | 330.466 | 15.787 |  |  |
| 526 | 423.693 | 48.720 | $SiO_2$ |  |
|  | −3000.977 | .034 |  |  |
| 527 | 584.671 | 78.378 | $SiO_2$ | 159 |
| AS | −341.375 | 13.393 |  |  |
| 528 | −276.351 | 6.015 | $SiO_2$ |  |
|  | −2430.384 | 49.784 |  |  |
| 529 | −282.253 | 33.801 | $SiO_2$ |  |
|  | −247.816 | .751 |  |  |
| 530 | 497.380 | 43.718 | $SiO_2$ | 170 |
|  | −593481.158 | .762 |  |  |
| 531 | 257.876 | 58.302 | $SiO_2$ |  |
|  | 1283.553 | .760 |  |  |
| 532 | 192.763 | 41.022 | $SiO_2$ |  |
|  | 379.416 | 1.212 |  |  |
| 533 | 158.692 | 33.559 | $SiO_2$ |  |
|  | 318.371 | 10.419 |  |  |
| 534 | 602.941 | 22.348 | $SiO_2$ |  |
|  | 312.341 | .449 |  |  |
| 535 | 151.612 | 13.858 | $SiO_2$ |  |
|  | 94.174 | 13.001 |  |  |
| 536 | 178.383 | 6.551 | $SiO_2$ |  |
|  | 47.957 | 2.052 |  |  |
| 537 | 47.759 | 28.153 | $SiO_2$ |  |
|  | 457.020 | 3.585 |  |  |
| P5 | ∞ | 2.000 | $SiO_2$ |  |
|  | ∞ |  |  |  |
| IM |  |  |  |  |

TABLE 6

λ(193 nm)

| No. | r (mm) | d (mm) | Glass | $H_{max}$ (mm) |
|---|---|---|---|---|
| 0 | ∞ | 13.589 |  | 63.2 |
| 601 | −153.8668 | 8.593 | $SiO_2$ |  |
|  | 536.387 | 13.446 |  |  |
| 602 | −489.958 | 16.326 | $SiO_2$ |  |
|  | −180.299 | 8.335 |  |  |
| 603 | −139.921 | 17.269 | $SiO_2$ |  |
|  | −183.540 | .726 |  |  |
| 604 | −5959.817 | 27.191 | $SiO_2$ |  |
|  | −213.388 | .720 |  |  |
| 605 | 540.568 | 28.565 | $SiO_2$ |  |
|  | −384.411 | .721 |  | 100.4 |
| 606 | 228.447 | 27.846 | $SiO_2$ |  |
|  | 39808.827 | 1.596 |  |  |
| 607 | 145.747 | 26.420 | $SiO_2$ |  |
|  | 99.912 | 29.130 |  |  |
| 608 | 551.820 | 28.093 | $SiO_2$ |  |
|  | 125.153 | 27.708 |  |  |
| 609 | −224.142 | 16.347 | $SiO_2$ |  |
|  | −120.259 | 3.704 |  |  |
| 610 | −120.684 | 7.531 | $SiO_2$ | 60.7 |
|  | 190.217 | 30.347 |  |  |
| 611 | −127.179 | 9.201 | $SiO_2$ |  |
|  | −2280.949 | 10.944 |  |  |
| 612 | −402.034 | 21.512 | $SiO_2$ |  |
|  | −163.852 | .720 |  |  |
| 613 | 558.842 | 36.296 | $SiO_2$ |  |
|  | −232.880 | .721 |  |  |
| 614 | 326.378 | 40.631 | $SiO_2$ | 102.3 |
|  | −458.721 | 1.006 |  |  |
| 615 | 243.250 | 21.969 | $SiO_2$ |  |
|  | 1849.289 | .953 |  |  |
| 616 | 1818.775 | 11.594 | $SiO_2$ |  |
|  | 120.678 | 44.346 |  |  |
| 617 | −193.008 | 8.915 | $SiO_2$ |  |
|  | 164.718 | 41.514 |  | 71.6 |
| 618 | −127.692 | 10.925 | $SiO_2$ |  |
|  | 522.864 | 4.106 |  |  |

TABLE 6-continued

λ(193 nm)

| No. | r (mm) | d (mm) | Glass | $H_{max}$ (mm) |
|---|---|---|---|---|
| 619 | 427.581 | 53.250 | CaF$_2$ | |
|  | −161.175 | .720 |  | 97.4 |
| 620 | 472.871 | 36.987 | CaF$_2$ | 106.2 |
|  | −413.834 | 5.594 |  | 106.7 |
| 621 | −527.170 | 9.730 | SiO$_2$ | 106.2 |
|  | 249.617 | 5.154 |  | 107.7 |
| 622 | 282.914 | 48.128 | CaF$_2$ | 108.6 |
|  | −361.054 | 9.000 |  | 109.3 |
| AS |  | .011 |  | 108.2 |
| 623 | 513.367 | 44.253 | CaF$_2$ | |
|  | −251.673 | 14.542 |  | 108.7 |
| 624 | −181.317 | 14.388 | SiO$_2$ | 107.9 |
|  | −1446.451 | 34.190 |  | 113.7 |
| 625 | −221.707 | 30.966 | SiO$_2$ | 114.7 |
|  | −174.183 | .778 |  | 119.4 |
| 626 | 367.930 | 29.615 | SiO$_2$ | |
|  | −5635.900 | .727 |  | |
| 627 | 149.485 | 42.977 | SiO$_2$ | |
|  | 478.121 | .974 |  | |
| 628 | 152.986 | 28.094 | SiO$_2$ | |
|  | 224.466 | 14.618 |  | |
| 629 | 794.048 | 14.783 | SiO$_2$ | |
|  | 152.177 | 2.330 |  | |
| 630 | 109.931 | 39.083 | SiO$_2$ | |
|  | 53.759 | 5.493 |  | |
| 631 | 52.584 | 31.677 | CaF$_2$ | |
|  | 582.406 | 2.674 |  | |
| P6 | ∞ | 2.000 | CaF$_2$ | |
|  | ∞ | 12.521 |  | |
| IM | ∞ | .000 |  | 14.5 |

I claim:

1. A reduction projection objective with a lens arrangement comprising:
   a first positive lens group,
   a first negative lens group,
   a second positive lens group,
   a second negative lens group forming a waist, each of said lens groups comprising more than one lens, and
   a further lens arrangement containing a system diaphragm,
   wherein at least one of two next lenses before said system diaphragm AS has negative refractive power, and
   wherein the projection objective has a reduction magnification.

2. A projection objective with a lens arrangement comprising:
   a first positive lens group,
   a first negative lens group,
   a second positive lens group,
   a second negative lens group, each of said lens groups comprising more than one lens, and
   a further lens arrangement containing a system diaphragm, and
   at least three positive lenses before said system diaphragm.

3. A projection objective with a lens arrangement comprising:
   a first positive lens group,
   a first negative lens group,
   a second positive lens group,
   a second negative lens group,
   a further lens arrangement containing a system diaphragm, and
   at least one spherically over-correcting air space between adjacent lenses in front of said system diaphragm.

4. A projection objective with at least two waists and three bulges, comprising a system diaphragm arranged in a region of a last bulge on an image side of said projection objective, and a pair of lenses before said system diaphragm, wherein at least one lens of said pair of lenses is negative.

5. The projection objective according to claim 1, consisting of a plurality of lenses of the same material.

6. The projection objective according to claim 5, in which said plurality of lenses consists of purely quartz glass.

7. The projection objective according to claim 1, consisting of a plurality of lenses of two different materials.

8. The projection objective according to claim 1, consisting of a partially achromatized quartz glass/calcium fluoride objective.

9. The projection objective according to claim 8, in which said projection objective is arranged for a wavelength of 193 nm.

10. The projection objective according to claim 1, comprising a system diaphragm and a plurality of lenses, where at least one of two next lenses before or after said system diaphragm has negative refractive power.

11. A reduction projection objective with a lens arrangement comprising:
    a first positive lens group,
    a first negative lens group,
    a second positive lens group,
    a second negative lens group forming a waist, each of said lens groups comprising more than one lens, and
    a further lens arrangement containing a system diaphragm,
    wherein at least one of two next lenses before said system diaphragm AS has negative refractive power, and
    wherein the projection objective has a reduction magnification, further comprising at least three lenses on an object side of said projection objective, two of said three lenses having negative refractive power.

12. The projection objective according to claim 11, in which said two of said first three lenses are in a −+− or −−+ arrangement.

13. Projection exposure equipment for microlithography, comprising a projection objective according to one of claims 1–4.

14. A projection objective according to claim 2, wherein at least one of two next lenses before or after said system diaphragm AS has negative refractive power.

15. A projection objective according to claim 3, wherein at least one of two next lenses before or after said system diaphragm AS has negative refractive power.

16. A projection objective according to claim 4, wherein at least one of two next lenses before or after said system diaphragm AS has negative refractive power.

17. A projection objective according to claim 3, comprising at least three lenses before said system diaphragm.

18. A projection objective according to claim 4, comprising at least three lenses before said system diaphragm.

19. A projection objective according to claim 3, comprising a system diaphragm arranged in a region of a last bulge on an image side of said projection objective, and a pair of lenses before or after said system diaphragm, wherein at least one lens of said pair of lenses is negative.

20. A projection objective according to claim 3, wherein said projection objective has a numerical aperture on an image side of said projection objective of at least 0.65.

21. A projection objective according to claim 20, wherein said numerical aperture is at least 0.70.

22. The projection objective according to claim 3, consisting of a plurality of lenses of the same material.

23. The projection objective according to claim 22, wherein said plurality of lenses consists of purely quartz glass.

24. The projection objective according to claim 3, consisting of a plurality of lenses of two different materials.

25. The projection objective according to claim 3, consisting of a partially achromatized quartz glass/calcium fluoride objective.

26. The projection objective according to claim 25, wherein said projection objective is arranged for a wavelength of 193 nm.

27. The projection objective according to claim 3, comprising a system diaphragm and a plurality of lenses, where at least one of two next lenses before or after said system diaphragm has negative refractive power.

28. A projection objective comprising a system diaphragm arranges in a region of a last bulge on an image side of said projection objective, and a pair of lenses before said system diaphragm, wherein at least one lens of said pair of lenses is negative, further comprising a spherically over-correcting air space arranged adjacent to at least one of two next lenses.

29. The projection objective according to claim 3, further comprising at least three lenses on an object side of said projection objective, two of said first three lenses having negative refractive power.

30. The projection objective according to claim 28, wherein said two of said first three lenses are in a –+– or ––+ arrangement.

31. A projection objective according to claim 4, wherein said projection objective has a numerical aperture on an image side of said projection objective of at least 0.65.

32. A projection objective according to claims 31, wherein said numerical aperture is at least 0.70.

33. The projection objective according to claim 4, consisting of a plurality of lenses of the same material.

34. The projection objective according to claim 33, wherein said plurality of lenses consists of purely quartz glass.

35. The projection objective according to claim 4, consisting of a plurality of lenses of two different materials.

36. The projection objective according to claim 4, consisting of a partially achromatized quartz glass/calcium fluoride objective.

37. The projection objective according to claim 36, wherein said projection objective is arranged for a wavelength of 193 nm.

38. The projection objective according to claim 4, comprising a system diaphragm and a plurality of lenses, where at least one of two next lenses before or after said system diaphragm has negative refractive power.

39. The projection objective according to claim 4, further comprising a spherically over-correcting air space arranged adjacent to said at least one of two next lenses.

40. The projection objective according to claim 4, further comprising at least three lenses on an object side of said projection objective, two of said first three lenses having negative refractive power.

41. The projection objective according to claim 40, wherein said two of said first three lenses are in a –+– or ––+ arrangement.

42. A process for production of microstructured components, comprising exposing a substrate provided with a photosensitive layer by a mask and a projection objective according to claim 1.

43. A process for production of microstructured components, comprising exposing a substrate provided with a photosensitive layer by a mask and a projection objective according to claim 2.

44. A process for production of microstructured components, comprising exposing a substrate provided with a photosensitive layer by a mask and a projection objective according to claim 3.

45. A process for production of microstructured components, comprising exposing a substrate provided with a photosensitive layer by a mask and a projection objective according to claim 4.

46. A reduction projection objective with a lens arrangement comprising:

a first positive lens group, a first negative lens group, a second positive lens group, a second negative lens group, each of said lens groups comprising more than one lens, and a further lens arrangement containing a system diaphragm, wherein at least one of two next lenses before said system diaphragm AS has negative refractive power, and wherein the projection objective has a reduction magnification, and wherein said projection objective has a numerical aperture on an image side of said projection objective of at least 0.65.

47. A reduction projection objective with a lens arrangement comprising:

a first positive lens group, a first negative lens group.

a second positive lens group, a second negative lens group, each of said lens groups comprising more than one lens, and a further lens arrangement containing a system diaphragm, wherein at least one of two next lenses before or after said system diaphragm AS has negative refractive power, and wherein the projection objective has a reduction magnification, further comprising a spherically over-correcting air space arranged adjacent to said at least one of two next lenses.

48. A process for production of microstructured components, comprising exposing a substrate provided with a photosensitive layer by a mask and a projection objective according to claim 47.

49. The process according to claim 48, further comprising structuring said photosensitive layer corresponding to a pattern contained on said mask.

50. A projection objective according to claim 46, wherein said numerical aperture is at least 0.70.

* * * * *